(12) United States Patent
Blier et al.

(10) Patent No.: US 9,549,470 B2
(45) Date of Patent: Jan. 17, 2017

(54) TRANSCEIVER MODULE ADAPTER DEVICE

(71) Applicant: EXFO Inc., Quebec (CA)

(72) Inventors: Michel Blier, Montreal (CA); Patrick Begin, Mirabel (CA); Sergio Prestipino, Notre-Dame-de-L'ile-Perrot (CA)

(73) Assignee: EXFO Inc., Quebec (CA)

( * ) Notice: Subject to any disclaimer, the term of this patent is extended or adjusted under 35 U.S.C. 154(b) by 133 days.

(21) Appl. No.: 14/471,047

(22) Filed: Aug. 28, 2014

(65) Prior Publication Data

US 2015/0092363 A1    Apr. 2, 2015

Related U.S. Application Data

(60) Provisional application No. 61/883,408, filed on Sep. 27, 2013.

(51) Int. Cl.
| | |
|---|---|
| *H05K 1/00* | (2006.01) |
| *H05K 1/18* | (2006.01) |
| *G02B 6/00* | (2006.01) |
| *H05K 1/02* | (2006.01) |

(52) U.S. Cl.
CPC .............. *H05K 1/189* (2013.01); *G02B 6/00* (2013.01); *H05K 1/0243* (2013.01); *H05K 2201/10189* (2013.01)

(58) Field of Classification Search
USPC ..................................... 361/749, 748, 679, 1
See application file for complete search history.

(56) References Cited

U.S. PATENT DOCUMENTS

| | | |
|---|---|---|
| 5,579,204 A | 11/1996 | Nelson et al. |
| 5,865,650 A | 2/1999 | Marian, Jr. et al. |
| 7,309,173 B2 | 12/2007 | Epitaux et al. |
| 7,311,530 B2 | 12/2007 | Ice et al. |
| 7,757,929 B2 | 7/2010 | Ice et al. |
| 8,328,434 B2 | 12/2012 | Wang et al. |
| 2009/0002952 A1* | 1/2009 | Mesmer ................ G09G 5/006 361/720 |
| 2013/0121651 A1* | 5/2013 | Takahashi .............. G02B 6/262 385/89 |

* cited by examiner

*Primary Examiner* — Andargie M Aychillhum

(57) ABSTRACT

There is provided an adapter device for connecting and interfacing a transceiver module in conformance with first mechanical specifications and first connector specifications into a host socket adapted to receive transceiver modules in conformance with second mechanical specifications and second connector specifications. The adapter device comprises: a rigid-flex circuit board having first and second levels of rigid circuit board portions and a flexible circuit board portion interconnecting the two levels to convey high-speed electrical signals therebetween, the two levels being integral with said flexible circuit board portion; a first connector mounted on the first level of rigid circuit board and in conformance with the first connector specifications, for electrically connecting the transceiver module to the adapter device to convey high-speed signals; and a second connector mounted on the second level of rigid circuit board and in conformance with the second connector specifications, for electrically connecting the adapter device into the host socket to convey high-speed signals.

22 Claims, 10 Drawing Sheets

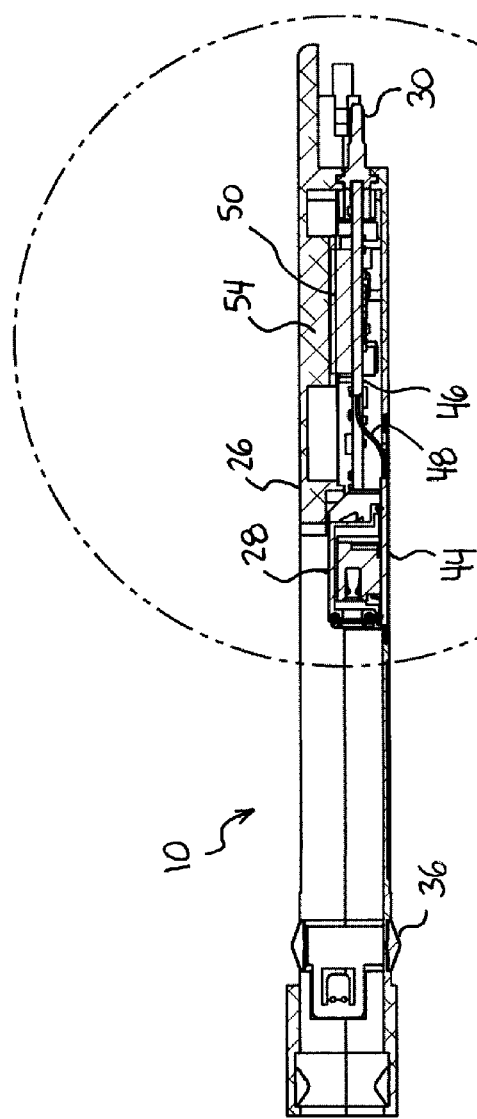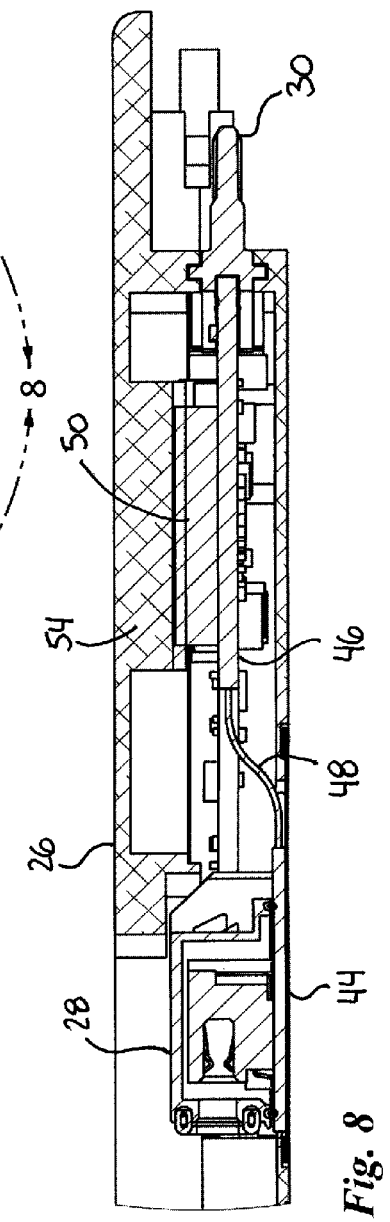

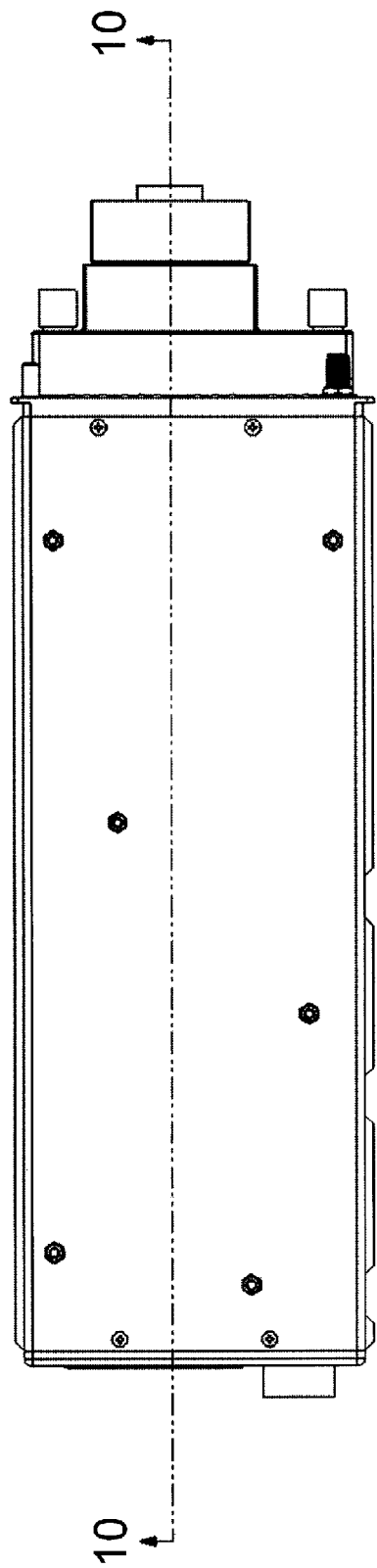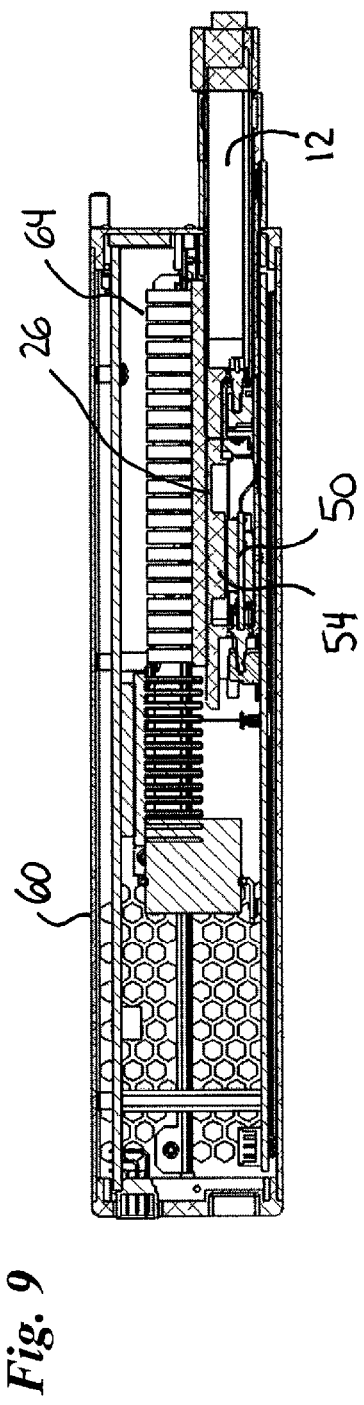
Fig. 9
Fig. 10

TRANSCEIVER MODULE ADAPTER DEVICE

CROSS-REFERENCE TO RELATED APPLICATIONS

This application claims priority under 35 USC §119(e) of U.S. provisional patent application 61/883,408 filed Sep. 27, 2013; the specification of which is hereby incorporated by reference.

TECHNICAL FIELD

The invention relates to electrical adapter devices, and more specifically to high-speed-signal adapter devices intended to connect transceiver modules into transceiver-module host sockets adapted to receive transceiver modules having a different form factor.

BACKGROUND OF THE ART

Optical transceiver modules are used in telecommunication and data communication networks to interface network equipment with the physical transmission layer. Industry Standards such as the 100 G Form-factor Pluggable Multi-Source Agreement (CFP MSA), CFP2 and CFP4 MSA, define the form factor and the electrical and mechanical requirements of hot-pluggable optical transceiver modules. Such hot-pluggable optical transceiver modules are widely used in the telecommunication industry for their ability to interface generic network equipment with a wide variety of optical fibers and modulation formats, thereby providing network equipment with great flexibility.

Industry Standards on hot-pluggable optical transceiver modules are in constant evolution. For example, the CFP MSA provides for a transition from CFP to CFP2 and to CFP4, each specifying 100 G optical transceiver modules with progressively smaller form factors. Of course, the same scenario occurs for 10 G optical transceiver modules such as the Small Form-factor Pluggable Multi-Source Agreement (SFP MSA) with the enhanced SFP (SFP+). As the telecommunication and computer network industry migrate from one form factor to another, prior equipment, including network equipment (e.g. Ethernet switches, network interface cards, etc.) as well as test and measurement equipment, may become obsolete. An adapter device designed to change a previous form factor host socket into one for receiving a more recent form factor transceiver module may extend the lifetime of equipment without any permanent physical change to it and may then also provide more flexibility to support transceivers of multiple form factors.

Adapters exist in the industry for fitting transceiver modules of a given form factor to host sockets adapted to receive transceiver modules of another larger form factor. However, as the form factors become smaller, it becomes more difficult to fit the transceiver module and the required electrical connections and electronics into an adapter, so that it fits in the form factor corresponding to the host socket.

SUMMARY

There is provided an adapter device for connecting and interfacing a transceiver module in conformance with first mechanical specifications (form factor, dimensions, etc.) and first connector specifications (e.g. CFP MSA industry Standard) into a host socket adapted to receive transceiver modules in conformance with second mechanical specifications and second connector specifications (e.g. CFP2 MSA industry Standard). Because space remaining in to the receiving form factor (e.g. CFP cage) after insertion of the transceiver module (e.g. CFP2) is very limited, it is very difficult to fit in that space the electrical connections and electronics that are required to interface from the transceiver module to the host socket.

The proposed adapter device comprises a multi-level rigid-flex circuit board to facilitate the interface between the received transceiver module and the host socket. The flexible portion of the rigid-flex circuit board connects two levels of rigid circuit boards and provides enhanced adjustability in the offset (i.e. the difference in height) between the two levels, without the use of other types of flexible cables that are bulky and for which there is not much room in the adapter device when considering the other mechanical and electronic components that are also needed in the adapter device. Also, because the difference in height is very small between the form factor of the received transceiver module (e.g. CFP2) and that of the transceiver module normally received by the host socket (e.g. CFP), the positions of the two levels of rigid circuit boards are almost solely dictated respectively by connector for the inserted transceiver module (female CFP2 connector) and the connector interfacing with the host socket (male CFP connector). There is therefore not much possible offset adjustment between the two levels of PCB to accommodate industry-available connectors to interconnect the two levels.

There is provided an adapter device for connecting and interfacing a transceiver module in conformance with first mechanical specifications and first connector specifications into a host socket adapted to receive transceiver modules in conformance with second mechanical specifications and second connector specifications. The adapter device comprises: a rigid-flex circuit board having first and second levels of rigid circuit board portions and a flexible circuit board portion interconnecting the two levels to convey high-speed electrical signals therebetween, the two levels being integral with said flexible circuit board portion; a first connector mounted on the first level of rigid circuit board and in conformance with the first connector specifications, for electrically connecting the transceiver module to the adapter device to convey high-speed signals; and a second connector mounted on the second level of rigid circuit board and in conformance with the second connector specifications, for electrically connecting the adapter device into the host socket to convey high-speed signals.

One aspect of the invention provides an adapter device for connecting and interfacing a transceiver module in conformance with first mechanical specifications and first connector specifications into a host socket adapted to receive transceiver modules in conformance with second mechanical specifications and second connector specifications. The adapter device comprises: a rigid-flex circuit board having first and second levels of rigid circuit board portions and a flexible circuit board portion interconnecting said first and second levels to convey high-speed electrical signals therebetween, said first and second levels being integral with said flexible circuit board portion; a first connector mounted on said first level of said circuit board and in conformance with said first connector specifications, for electrically connecting said transceiver module to said adapter device to convey high-speed signals; and a second connector mounted on said second level of said circuit board and in conformance with said second connector specifications, for electrically connecting said adapter device into said host socket to convey high-speed signals.

Another aspect of the invention provides an adapter device for connecting and interfacing a transceiver module in conformance with first mechanical specifications and first connector specifications into a host socket adapted to receive transceiver modules in conformance with second housing form factor and second connector specifications. The adapter device comprises: an outer housing in conformance with said second mechanical specifications, the housing having a front end that is to be accessible when the adapter device is inserted into said host socket and having an opening for inserting said transceiver module into said adapter device; a receiving socket defined within the outer housing and in conformance with said first mechanical specifications, for receiving said transceiver module when the same is inserted into the adapter device through said opening; a rigid-flex circuit board disposed in said outer housing and having first and second levels of rigid circuit board portions and a flexible circuit board portion interconnecting said first and second levels to convey high-speed electrical signals therebetween, said first and second levels being integral with said flexible circuit board portion; a first connector mounted on said first level of said circuit board and in conformance with said first connector specifications, for electrically connecting said transceiver module to said adapter device to convey high-speed signals; and a second connector mounted on said second level of said circuit board and in conformance with said second connector specifications, for electrically connecting said adapter device into said host socket to convey high-speed signals.

Throughout this specification, reference is made to specifications as defined for instance by industry Standards or proprietary specifications. It will be understood that for hot-pluggable transceiver modules, such specifications typically at least comprise mechanical specifications defining the external shape and dimensions of the transceiver module and the internal shape and dimensions of the receiving socket in the host system, and connector specifications for the transceiver module to interface with the host system. The connector specifications typically comprise both mechanical specifications of the electrical connector (i.e. connector shape and dimensions, pin physical arrangement, etc.) and electrical specifications (i.e. defining the electrical signals conveyed through the electrical connector). Of course, it will be understood that additional types of specifications may be defined by industry Standards or proprietary specifications, such as specifications related to the optical connectors or to power dissipation.

In this specification, unless otherwise mentioned, word modifiers such as "substantially" and "about" which are modifying a condition or relationship characteristic of a feature of features of an embodiment, should be understood to mean that the condition or characteristic is defined to within tolerances that are acceptable to ensure proper operation of that embodiment for an application for which it is intended.

BRIEF DESCRIPTION OF THE DRAWINGS

Further features and exemplary advantages of the present invention will become apparent to the skilled person from the following detailed description, taken in conjunction with the appended drawings, in which:

FIG. 2 comprises FIG. 2A, FIG. 2B, FIG. 2C, FIG. 2D, FIG. 2E and FIG. 2F wherein

FIG. 7 is a longitudinal cross-sectional view of the adapter device of FIG. 1;

FIG. 8 is a close-up of the cross-sectional view of FIG. 7;

FIG. 9 is a top plan view of a host socket adapted in which an adapter is inserted;

FIG. 10 is a cross-sectional view taken along line 10-10 of FIG. 9;

It will be noted that throughout the appended drawings, like features are identified by like reference numerals.

DETAILED DESCRIPTION

Figure 1:
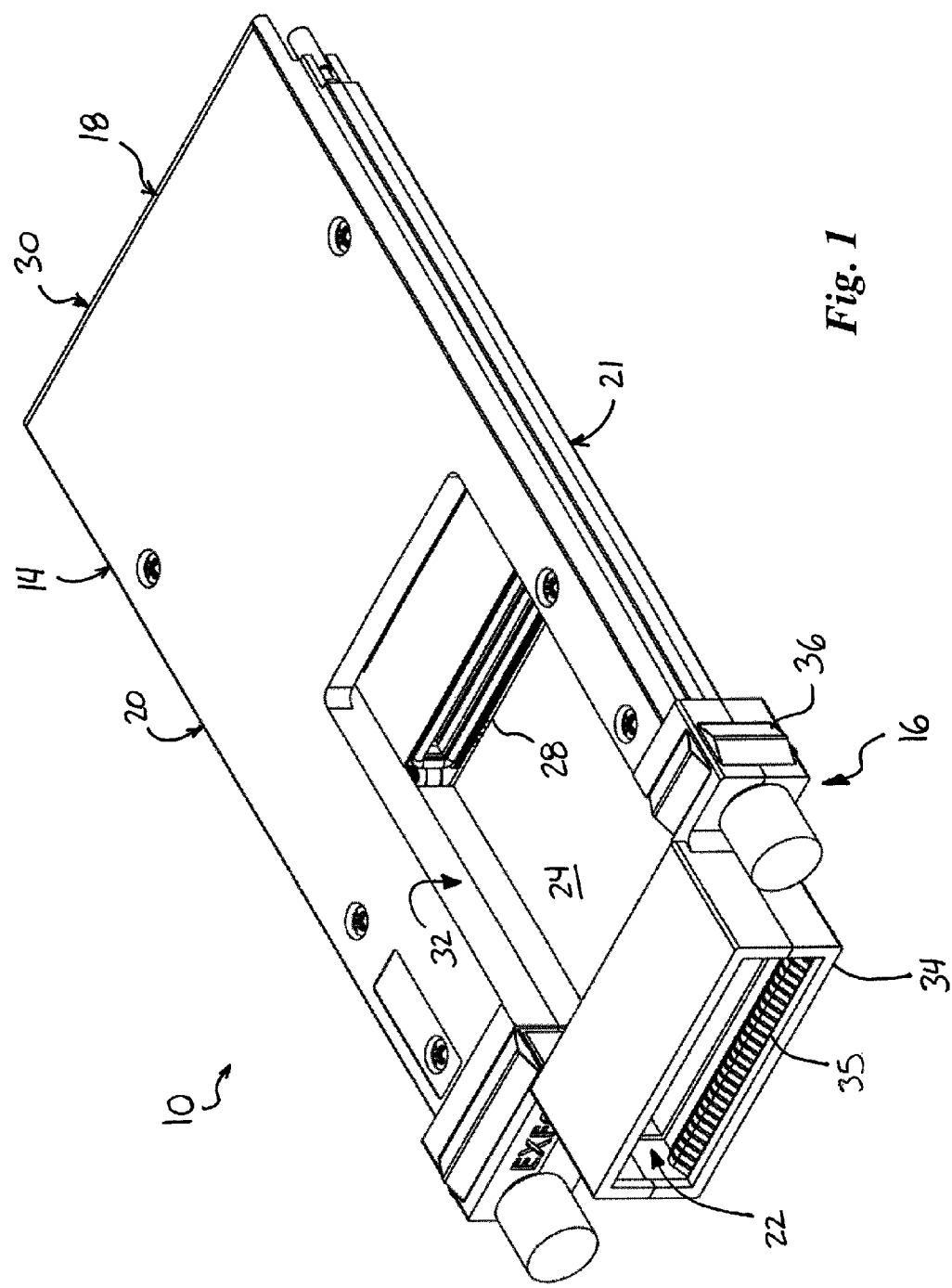
FIG. 1 is a front perspective view of an adapter device in accordance with one embodiment.
Figure 2D:
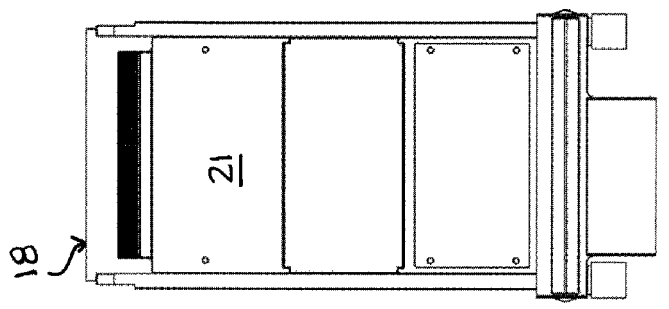
FIG. 2D is a bottom plan view.
Figure 2C:
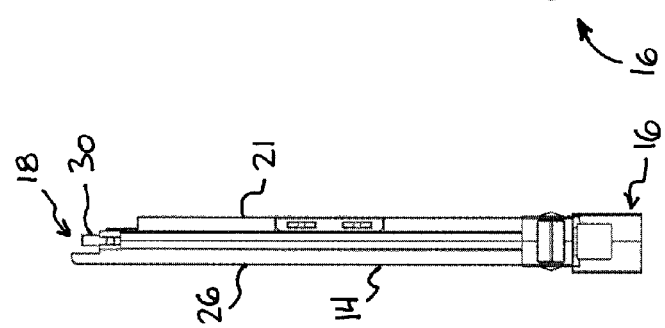
FIG. 2C is a right-side elevation view.
Figures 2B, 2E:
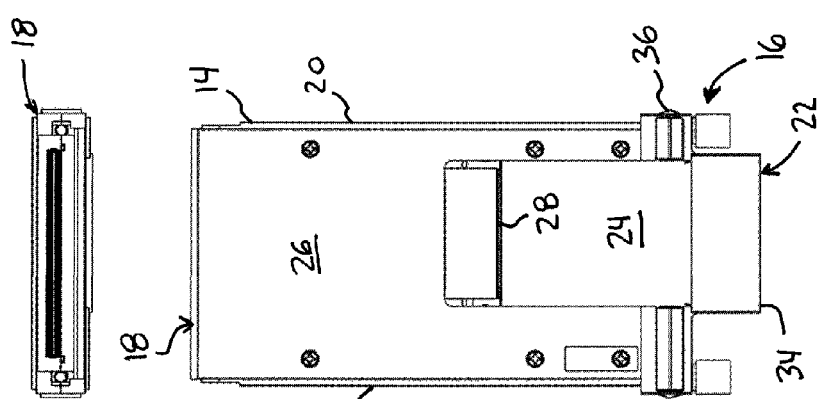
FIG. 2B is a top plan view.
FIG. 2E is a rear elevation view.
Figure 2F:
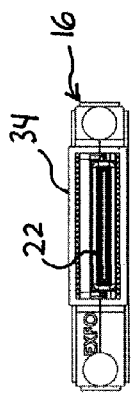
FIG. 2F is a front elevation view.
Figure 2A:
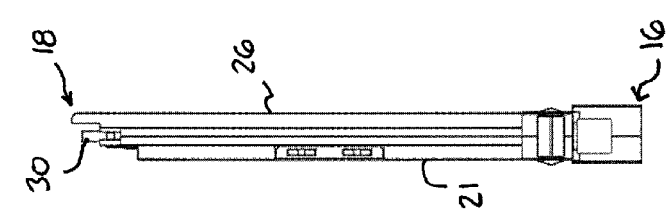
FIG. 2A is a left-side elevation view of the adapter device of FIG. 1.
Figure 3:
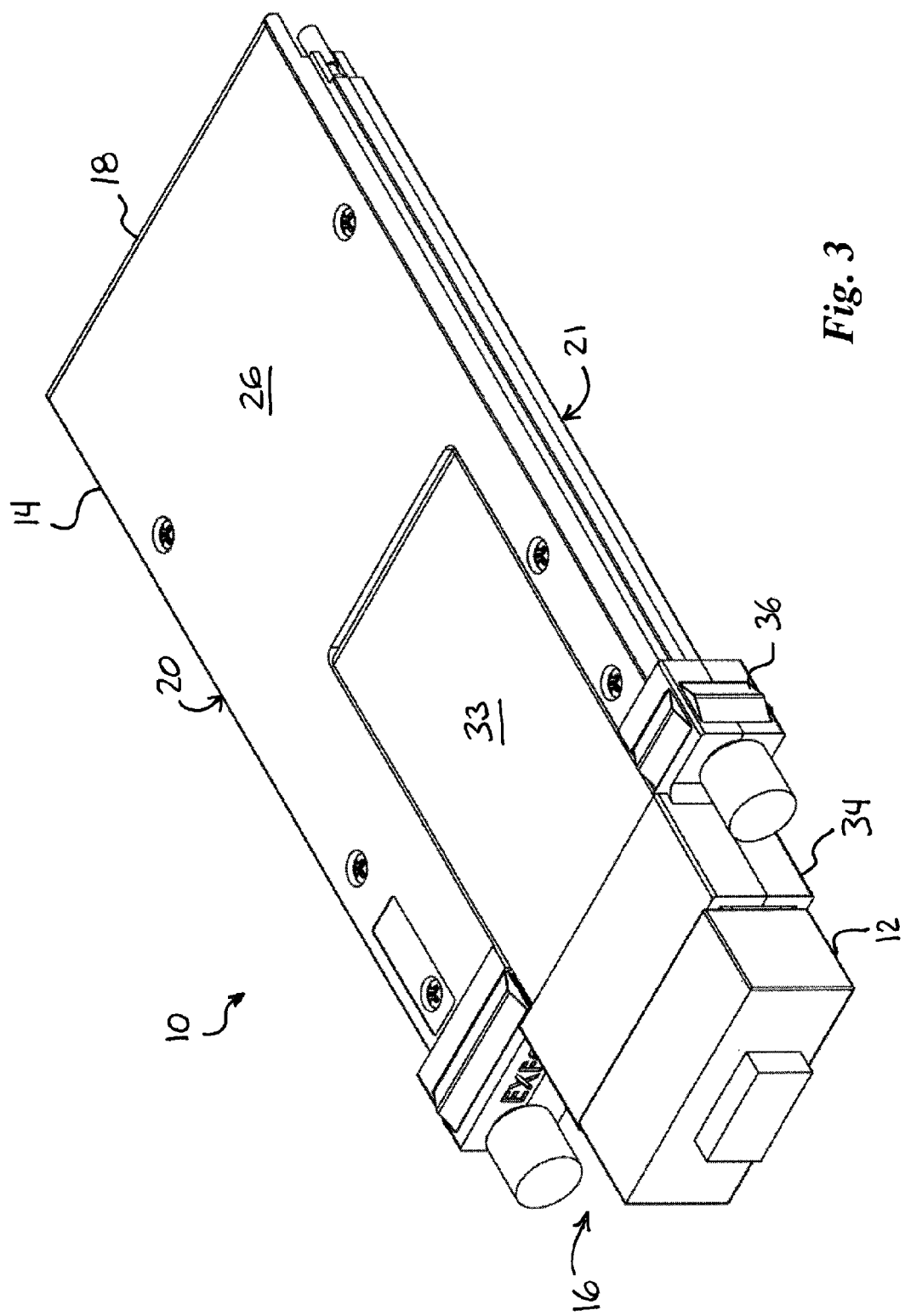
FIG. 3 is a perspective view of the adapter device of FIG. 1 shown with a transceiver module inserted therein.

Now referring to the drawings, FIGS. 1, 2, 3, 4 and 5 show one embodiment of an adapter device 10 for connecting and interfacing a CFP2 optical transceiver module 12 (shown in FIG. 3) into a CFP host socket.

It is noted that although the embodiments illustrated and described herein are designed for adapting a CFP2 transceiver module into a CFP host socket, it should be understood that these industry Standards are meant to be exemplary only and that the concepts and technical solutions described herein may apply similarly to adapter devices designed to adapt transceiver modules according to other industry Standards or proprietary specifications. For example, the adapter device described herein may be modified to adapt a CFP4 transceiver module into a CFP host socket, to adapt a 120 Gbs 12× Small Form-factor Pluggable (CXP) transceiver module into a CFP host socket, or to adapt a Quad (4-channel) Small Form-factor Pluggable (QSFP+) into a CFP host socket.

The adapter device 10 has a housing 14 enclosing the electrical connections and electronics required for interfacing a CFP2 transceiver module and a CFP host socket. The housing 14 has a front end 16 that extends outside the host socket and that is accessible when the adapter device 10 is inserted into a CFP host socket, as well as a rear end 18 and side, bottom and top walls 20, 21, 26 having shapes and dimensions in conformance with the CFP mechanical specifications in order to enable insertion of the adapter device 10 into a CFP host socket. The front end 16 has a front opening 22 having dimensions in conformance with the CFP2 mechanical specifications in order to allow insertion of a CFP2 transceiver module 12 into the adapter device 10 by sliding it through the front opening 22. When introduced in the adapter device 10, the transceiver module 12 inserts into a receiving socket 24 defined within the adapter device 10 and in conformance with CFP2 mechanical specifications.

Except for the front end 16 that extends outside the CFP host socket, the form factor of the adapter device 10 corresponds to that of a CFP transceiver module so that it can be inserted into, and thereby connected with, a CFP host socket adapted to receive such a CFP transceiver module, interchangeably with any conventional CFP transceiver module.

The adapter device 10 comprises a CFP2 female connector 28 (i.e. a CFP2 host connector) that is positioned at the rear end of the receiving socket 24 such that the transceiver module 12 electrically connects to the adapter device 10 when it is inserted therein. It also has a CFP male connector 30 (i.e. CFP module plug connector) at the rear end 18 of the housing 14 to electrically connect the adapter device 10 to the CFP2 host socket into which it is inserted.

The top wall 26 of the housing 14 has a cut-out window 32 that is shaped to receive the transceiver module 12 therein, the receiving socket 24 being positioned such that the transceiver module 12 extends within the window. The top wall 26 is hence shaped approximately in the form of a "U". The cut-out window 32 optimizes the space within the adapter device 10 considering the very small difference in height between the CFP form factor and the CFP2 form factor (13.6 mm vs 12.4 mm). Removing the top wall on the portion of the adapter device 10 that receives the CPF2 transceiver module 12 while leaving a full bottom wall 21 under the CPF2, provides enough room in height to accommodate the CFP2 transceiver module 12. Furthermore, the receiving socket 24 that receives the transceiver module 12 is configured such that the top wall 33 of the transceiver module 12 is substantially co-planar with the top wall 26 of the adapter device 10 in order for the top wall 33 of the transceiver module 12 to be in physical contact with the heat sink 64 (see FIGS. 9 and 10) of the CFP host socket into which it is inserted. This provides proper heat transfer from the transceiver module 12 to the heat sink 64 of the CFP host socket for dissipating heat produced by the transceiver module 12 when in operation.

In this embodiment, the front end 16 of the housing 14 also has a bezel portion 34 surrounding and defining the front opening 22 such that its shape and dimensions are complementary to the transverse cross-section of the CFP2 transceiver module 12. The bezel portion 34, in collaboration with the CFP2 female connector 28, secures the transceiver module 12 in place in the adapter device 10. In this way, the transceiver module 12 is prevented from tilting through the cut-out window 32 when it is inserted into the adapter device 10 before the adapter device 10 is inserted into the CFP host socket.

As can be seen on FIG. 1, shielding gaskets 35 are positioned at both the bottom and the top of the front opening 22 in order to provide ElectroMagnetic Interference (EMI) shielding between the CFP2 transceiver module 12 and the adapter device 10. In this embodiment, the shielding gaskets 35 are embodied as two finger strip gaskets that are fixed respectively on the top and bottom inner surfaces of the bezel portion 34. Referring back to FIGS. 1, 2, 3 and 4, further shielding gaskets 36 are also positioned on the outer surface of the housing 14, close to its front end 16 in order to provide EMI shielding between the adapter device 10 and the CFP host socket. In this embodiment, the shielding gaskets 36 are embodied as a plurality of metalized fabric shielding gasket strip sections that are separately fixed on the bottom, top, right and left sides of the housing 14.

Figure 4:
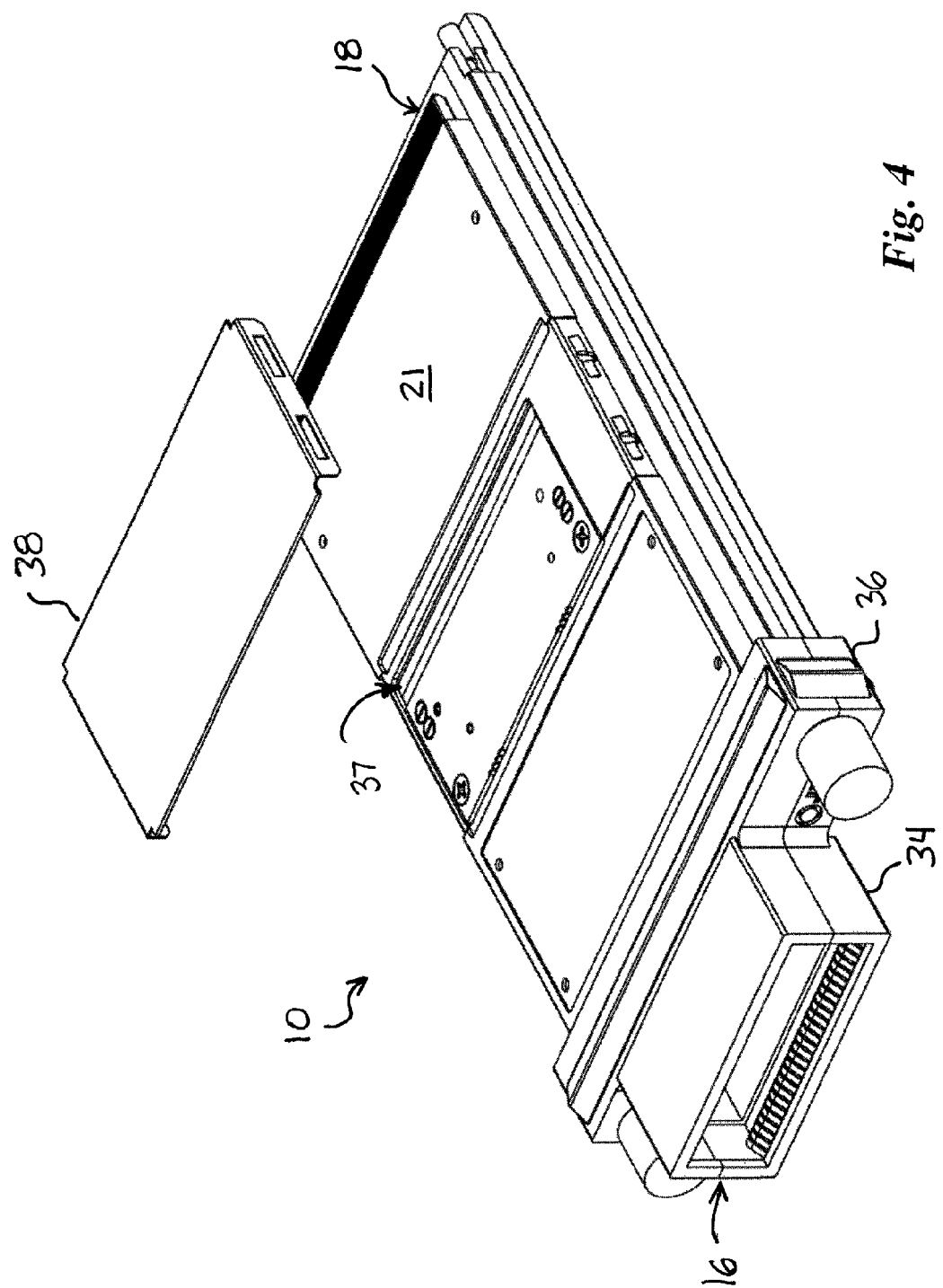
FIG. 4 is a partially exploded perspective view of the adapter device of FIG. 1 showing the adapter device upside-down to reveal the underneath thereof.

Now referring to FIG. 4, which depicts the adapter device 10 upside-down, the bottom wall 21 of the housing 14 has another cut-out window 37. The window 37 is shaped and positioned for the bottom PCB section 44 (see FIG. 6) to lie partly within. A cover plate 38 fastens to the housing 14 to cover the window 37 and protect the bottom PCB section 44. Again, cut-out window 37 optimizes the space within the adapter device 10 considering that the difference in height between the CFP form factor and the CFP2 form factor is very small (13.6 mm vs 12.4 mm).

Figure 5:
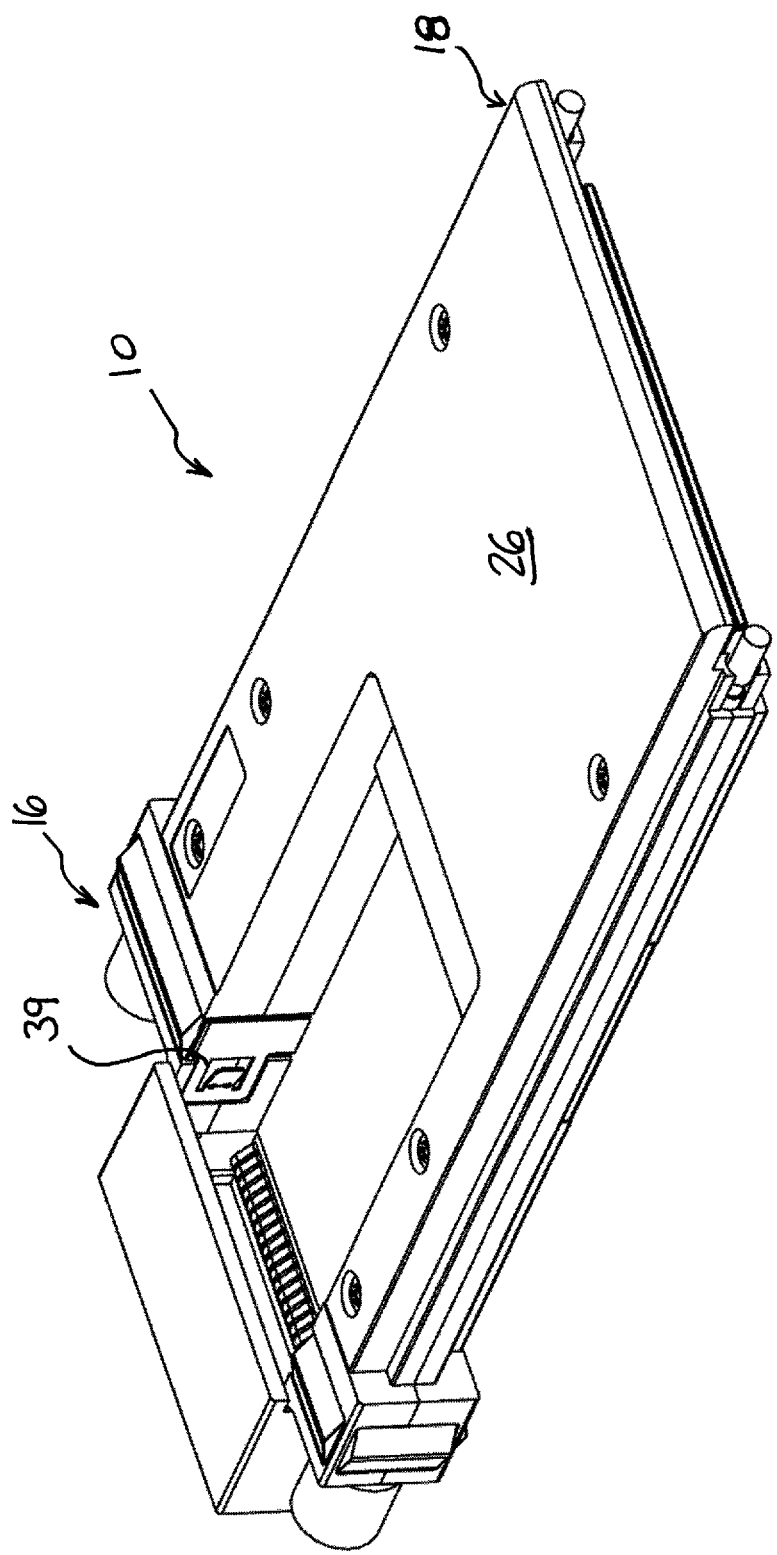
FIG. 5 is a rear perspective view of the adapter device of FIG. 1.

Now referring to FIG. 5 which depicts the adapter device 10 as seen from behind, the housing 14 also comprises optional spring-loaded retaining tabs 39 within the receiving socket 12 that together with a tappet (not shown) on the CFP2 transceiver module 12 forms a latching mechanism to releasably hold the transceiver module 12 in place when it is inserted into the adapter device 10. It should be noted that no latching mechanism 39 is provided on some other embodiments (not represented on the figures). In these cases, friction caused by EMI shielding gaskets 35 provides sufficient retaining force to properly hold the CFP2 transmitter module 12 in place without resort to any additional latching mechanism.

Figure 6:
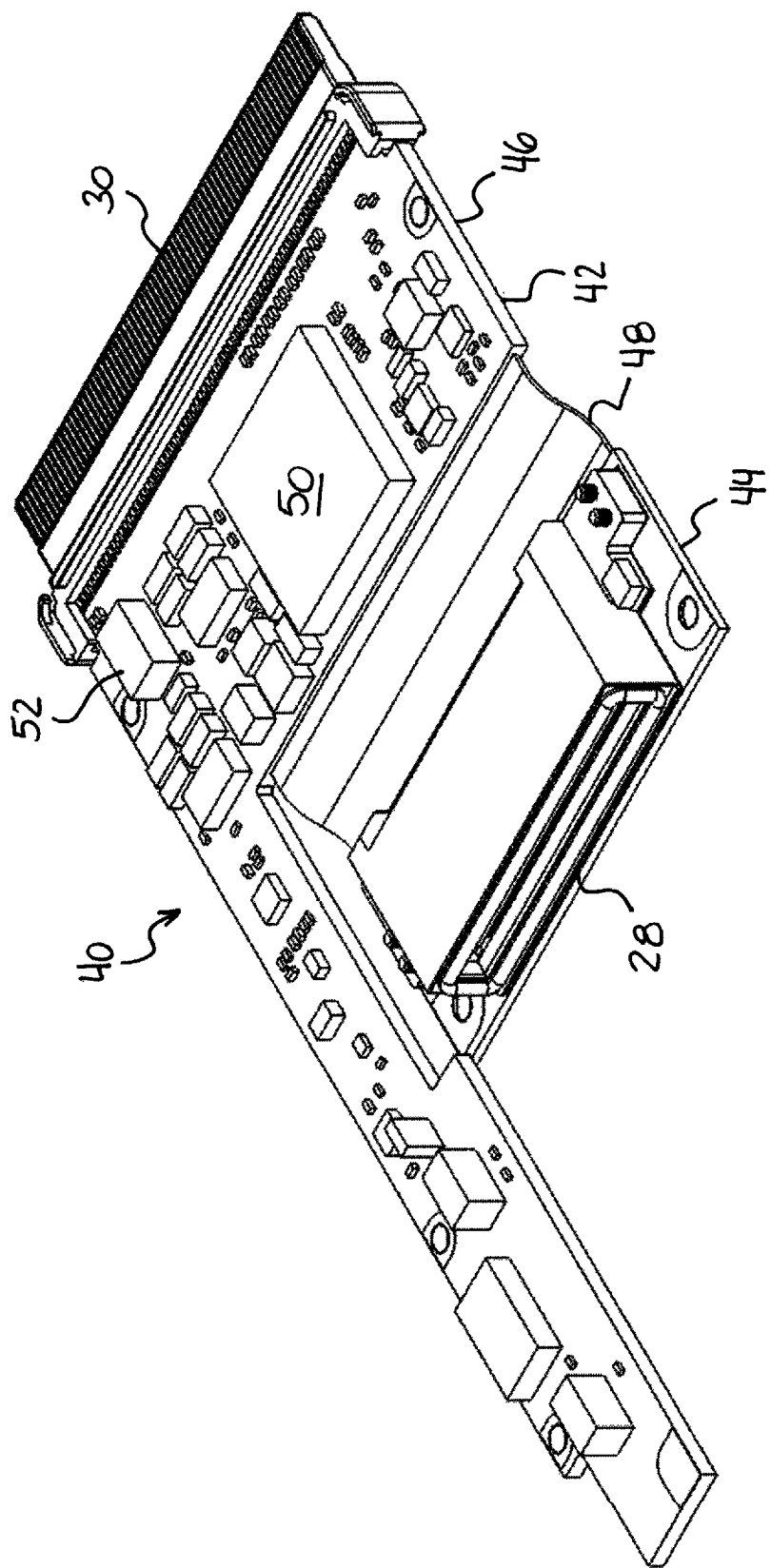
FIG. 6 is a perspective view of a rigid-flex circuit board assembly inside the adaptor device of FIG. 1.

Now referring to FIGS. 6, 7 and 8, the adapter device 10 not only mechanically and electrically interconnects the transceiver module 12 and the host socket, but also allows the two to be electrically interfaced. Specifically, even though CFP and CFP2 transceiver modules both support 100-Gbps optical signals, the electrical connector specifications of the high-speed electrical signals conveyed by their respective electrical connectors are different: CFP connector specifications define 10 serial electrical lanes of 10-Gbps data (10×10 G), whereas CFP2 connector specifications supports either 4 lanes of 25-Gbps data (4×25 G) or 10 lanes of 10-Gbps data (10×10 G). Appropriate electronic circuitry is therefore required in the adapter device 10 to allow these two different Standards to be interfaced.

Such electronics are provided on a circuit board assembly 40 comprising a Printed Circuit Board (PCB) 42.

The PCB 42 has a first PCB portion 44 on which the CFP2 female connector 28 is mounted and a second PCB portion 46 on which the CFP male connector 30 is mounted. A flexible PCB portion 48 electrically interconnects PCB portion 44 and PCB portion 46. A PCB manufactured with the technology enabling it to have integral rigid and flexible portions is referred to in the PCB industry as a "rigid-flex PCB".

As will now be explained, the rigid-flex PCB 42 is employed to address the fact that, because they are supposed to be used separately, the CFP and CFP2 industrial Standards were not conceived to be mutually mechanically compatible.

When designing electronic devices such as the adapter device 10, it is typically more cost effective to employ conventional, commercially-available components. In the illustrated embodiment, the adapter device 10 employs Standard-compliant, commercially-available CFP male connector 30 and CFP2 female connector 28. The CFP male connector 30 is a PCB edge-mounted connector such as manufactured by TE Connectivity (2057629-1), whereas the CFP2 female connector 28 is a PCB surface-mounted connector, such as manufactured by Yamaichi Electronics (CN121G-104-0002).

It should be understood that the position of the CFP male connector 30 on the adapter device 30 is defined by the CFP mechanical specifications. As a consequence, when using a PCB edge-mounted CFP male connector 30, the position in height of PCB portion 46 in the adapter device 10 is dictated by these CFP mechanical specifications. Similarly, when using a Standard-compliant, industry-available CFP2 female connector 28, for which the position of the receiving PCB relative to the connector is predetermined by the configuration of the connector, the position in height of PCB portion 44 is dictated by the position of the transceiver module 12 in the adapter device 10. Unfortunately, the very small difference in height between the CFP form factor and the CFP2 form factor (13.6 mm vs 12.4 mm) imposes strict constraints that do not provide sufficient freedom to position the transceiver module 12 so as to align PCB portion 44 and PCB portion 46 together at the same level. The flexible PCB portion 48 on the PCB 42 therefore allows electrical interconnection of PCB portion 44 and PCB portion 46 without employing a flexible cable with bulky connectors. Furthermore, since the CFP transceiver module 12 and the electronics that must be fitted on the circuit board assembly 40 would fill most of the space in the adapter device (see FIG. 1), in practice there would be no space available for such a bulky cable.

The CFP mechanical specifications and the CFP2 mechanical specifications also put constraints on the thickness of PCB portions 44 and 46. In order to comply with the CFP edge-mounted connectors, the thickness of PCB portion 46 should typically be 1.5 mm, whereas the CFP2 female connector 28 typically requires PCB portion 44 to have a thickness of 1.0 mm.

As can be seen from FIG. 6, the rigid-flex PCB 42 is made such that it can be manufactured as a single integral planar PCB which, in this embodiment, comprises PCB portion 44 having a thickness of 1.0 mm, PCB portion 46 having a thickness of 1.5 mm and a flexible PCB portion 48 in physical continuity between PCB portion 44 and PCB portion 46. The varying thickness and rigidity along the PCB 42 are obtained by an appropriate design of the PCB-layer stack-up, the number and the properties of the PCB-layer stack-up varying by sections on the surface of the PCB 42. The flexible PCB portion 48 is thereafter employed to offset the level of PCB portion 46 relative to PCB portion 44 in a mezzanine-type arrangement having two levels of PCB portions that are mutually parallel and that do not overlay. High-speed electrical signals are conveyed from one level to the other on high-speed electrical lines printed on the flexible PCB portion 48.

The circuit board assembly 40 comprises multiple electronic components including integrated circuits employed to interface the CFP2 transceiver module 12 to the CFP host socket. Notably, one major component employed for interfacing is a gearbox chip 50. The gearbox chip 50 is an integrated circuit that converts the 10 serial electrical lanes of 10-Gbps data (10×10 G) as defined by the CFP connector specifications to the 4 lanes of 25-Gbps data (4×25 G) as defined by the CFP2 connector specifications and vice-versa. In fact, on the transceiver side, the gearbox chip 50 and the other electronic components employed in this embodiment support both data configurations defined in the CFP2 connector specifications, i.e. either 4 lanes of 25-Gbps data (4×25 G) or 10 lanes of 10-Gbps data (10×10 G). The adapter device 10 thereby also supports both data configurations. In the illustrated embodiment, the gearbox chip 50, as well as most other electronic components, is positioned on PCB portion 46, which is the top PCB level. It is however noted that the gearbox chip 50 and the other electronic components 52 could alternatively be placed on PCB portion 44 by enlarging the surface of PCB portion 44 in favor of a smaller PCB portion 46.

It is noted that the PCB 42 may or may not contain embedded electronic components and, of course, electronic components may be mounted on the circuit board in accordance with through-hole, surface-mount or any other technology.

FIGS. 7 and 8 are cross-sectional views of the adapted device 10. This view shows that the adapter device 10 further comprises a heat riser 54—which is herein made of a block of thermally conductive material such as a thermally conductive plate—that is positioned on top of the gearbox chip 50 such that it is in physical contact therewith. The heat riser 54 conducts heat generated by the gearbox chip 50 and thermally links it to the top wall 26 of the adapter device 10, which is in physical contact with the heat sink 64 (see FIGS. 9 and 10) of the CFP host socket when in use. This allows for dissipation of heat generated by the gearbox chip 50 through the heat sink 64 of the CFP host socket. Of course, it will be understood that physical contact between the gearbox chip 50 and the heat riser 54 may involve the use thermal interface materials, such as a thermal paste, in order to increase heat transfer.

In this embodiment, the heat riser 54 is made as an integral part of the housing 14 and consists of an inward protrusion on the top wall 26, within the adapter device 10. In other words, the top wall 26 and the heat riser 54 are fabricated as a single unit from the same integral material (e.g. machined from the same bulk material), which can be aluminum or copper for example.

FIGS. 9 and 10 show an adapter device as inserted into the receiving CFP host socket 60. According to CFP specifications, the host socket 60 is to be provided with a heat sink 64 that is to be in physical contact with the top wall of a CFP transceiver module 12 inserted therein. It can be seen in FIG. 10 that, when the adapter device 10 is inserted in the CFP host socket 60, its top wall 26 is also in physical contact with the heat sink 64. This, along with the heat riser 54 allows dissipation of heat produced by the gearbox 50.

Figure 11:
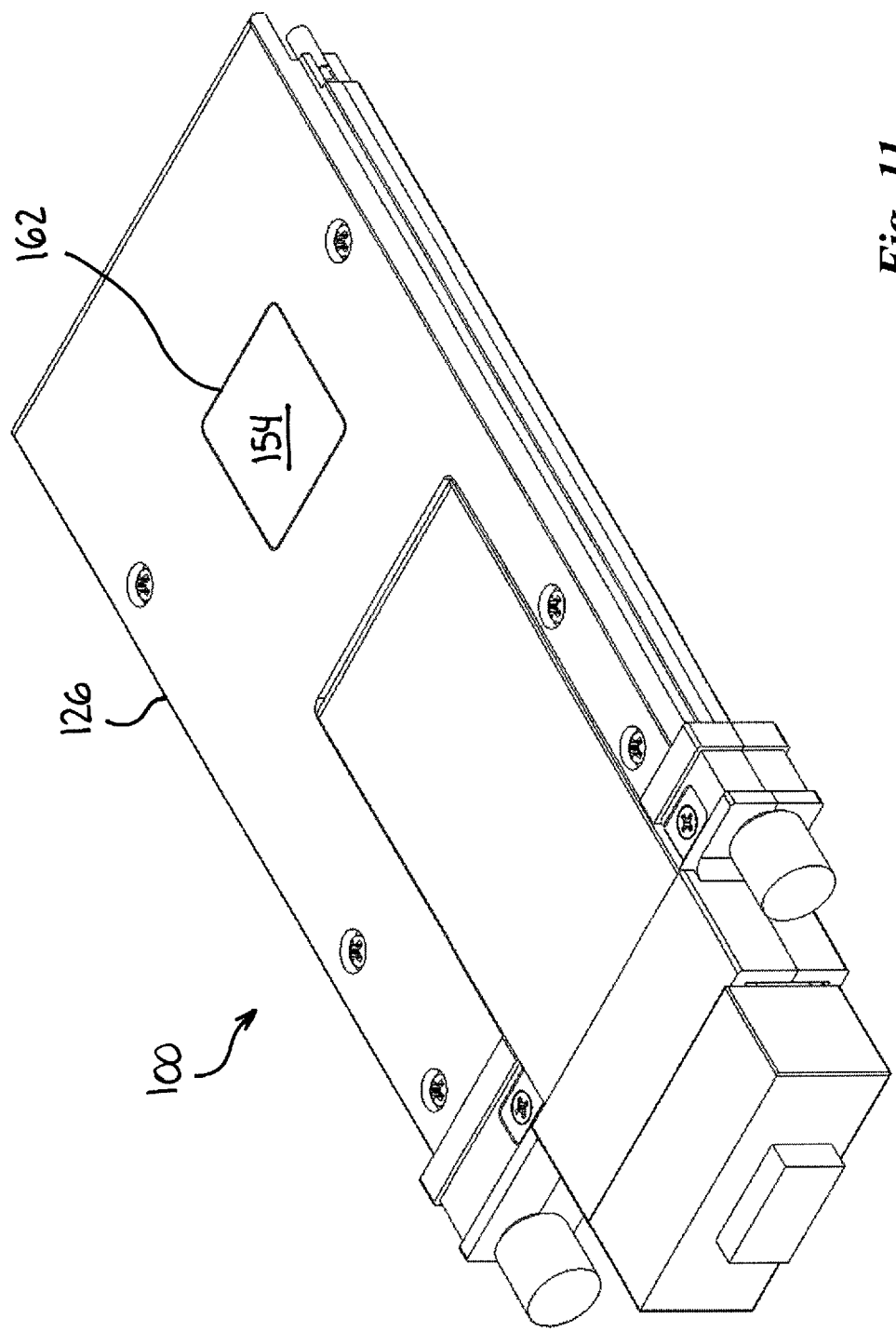
FIG. 11 is a perspective view of an adapter device in accordance with another embodiment wherein a hole is provided on the top wall for a heat riser.
Figure 12:
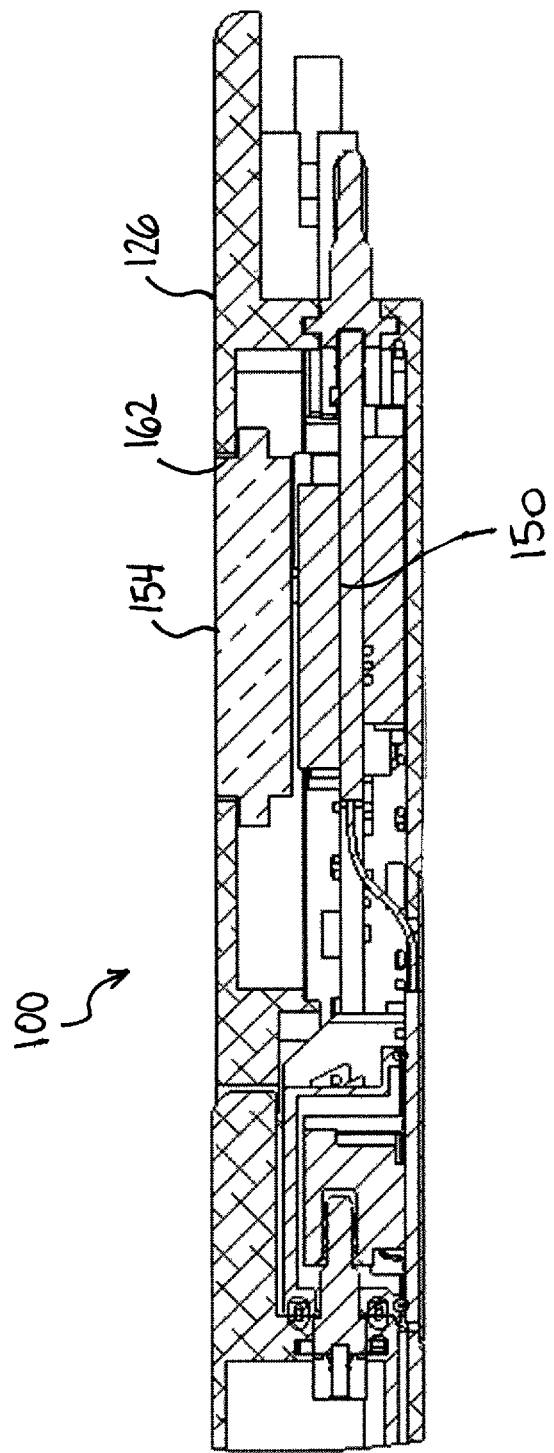
FIG. 12 is a partial cross-sectional view of the adapter device of FIG. 11.

FIGS. 11 and 12 show another embodiment of an adapter device 100 wherein the heat riser 154 is made separate from the top wall 126. In this case, the top wall 126 is provided with a hole 162 through which the heat riser 154 is exposed out of the adapter device 100 such that it is in physical contact with the heat sink of the host socket when the adapter device 100 is inserted into the host socket. Of course, the heat riser 154 is also in physical contact with the gearbox chip 150 inside the adapter device 10. In such an embodiment, the top wall 126 and the heat riser 154 can be made of different materials. For instance, the top wall 126 may be made of aluminum whereas the heat riser 154 is made of copper or any other highly thermally conductive material. The adapter device 100 of FIGS. 11 and 12 is similar to the adapter device 10 of FIGS. 1 to 10, but for the heat riser 154 that passes through the top wall 126. Similar parts and features are therefore not repeatedly described.

The embodiments described above are intended to be exemplary only. The scope of the invention is therefore intended to be limited solely by the appended claims.

What is claimed is:

1. An adapter device for connecting and interfacing a hot-pluggable transceiver module in conformance with first mechanical specifications and first connector specifications into a transceiver module host socket adapted to receive hot-pluggable transceiver modules in conformance with second mechanical specifications and second connector specifications, the adapter device comprising:

a rigid-flex circuit board having first and second levels of rigid circuit board portions and a flexible circuit board portion interconnecting said first and second levels to convey high-speed electrical signals therebetween, said first and second levels being integral with said flexible circuit board portion;

a first connector mounted on said first level of said circuit board and in conformance with said first connector specifications of said hot-pluggable transceiver module, for electrically connecting said hot-pluggable transceiver module to said adapter device to convey high-speed signals; and a second connector mounted on said second level of said circuit board and in conformance with said second connector specifications of said transceiver module host socket, for electrically connecting said adapter device into said transceiver module host socket to convey high-speed signals.

2. The adapter device as claimed in claim 1, further comprising a gearbox chip for converting high-speed signals in conformance with said first connector specifications to high-speed signals in conformance with said second connector specifications and vice-versa.

3. The adapter device as claimed in claim 2, wherein said gearbox chip is mounted on said second level of said circuit board.

4. The adapter device as claimed in claim 2, wherein said adapter device comprises an outer housing wherein the rigid flex circuit board is located, said adapter device further comprising a heat riser at least partly made of a thermally conductive material and thermally linking said gearbox chip to a wall of said outer housing of said adapter device that is to be in physical contact with a heat sink of said transceiver module host socket.

5. The adapter device as claimed in claim 4, wherein said heat riser and said wall are together made as a single unit from the same integral material.

6. The adapter device as claimed in claim 4, wherein said wall has a hole through which said heat riser is exposed out of the adapter device in order to physically contact said heat sink of said transceiver module host socket, said heat riser also being in physical contact with said gearbox chip.

7. The adapter device as claimed in claim 1, wherein the adapter device further comprises:

an outer housing within which the rigid-flex circuit board is located and in conformance with said second mechanical specifications, the housing having a front end that is to be accessible when the adapter device is inserted into said transceiver module host socket and having an opening for inserting said hot-pluggable transceiver module into said adapter device, and a receiving socket defined within the housing and in conformance with said first mechanical specifications, for receiving said hot-pluggable transceiver module when the same is inserted into the adapter device through said opening.

8. The adapter device as claimed in claim 1, wherein the adapter device further comprises:

an outer housing within which the rigid-flex circuit board is located, the housing having a front end that is to be accessible when the adapter device is inserted into said transceiver module host socket and having an opening for inserting said hot-pluggable transceiver module into said adapter device, and walls transverse to said front end; and a receiving socket defined within the housing for receiving said hot-pluggable transceiver module when the same is inserted into the adapter device;

at least one of said walls of said outer housing having a first window therethrough, said receiving socket being configured such that at least a portion of a housing of said hot-pluggable transceiver module is to extend within said first window when said hot-pluggable transceiver module is inserted into said adapter device.

9. The adapter device as claimed in claim 8, wherein said receiving socket is configured such that said at least a portion of a housing of said hot-pluggable transceiver module is to extend within said window in substantial coplanarity with said one of said walls having said window in order to obtain physical contact of said at least a portion of a housing of said hot-pluggable transceiver module with a heat sink of said transceiver module host socket.

10. The adapter device as claimed in claim 9, wherein at least one of said walls of said outer housing has a second window therethrough, said first level of said circuit board lying at least partly within said second window.

11. The adapter device as claimed in claim 1, wherein the adapter device comprises an outer housing within which the rigid flex circuit board is located, the outer housing having a front end that is to be accessible when the adapter device is inserted into said transceiver module host socket and an opening for inserting said hot-pluggable transceiver module into said adapter device, said opening being surrounded by a bezel portion defining said opening such that the same has a shape that is complementary to a transverse cross-section of said hot-pluggable transceiver module to be received therein.

12. The adapter device as claimed in claim 11, wherein said housing further comprises spring-loaded retaining tabs adapted to releasably hold said hot-pluggable transceiver module in place when inserted.

13. The adapter device as claimed in claim 2, wherein high-speed signals in conformance with said first connector specifications comprise either a plurality of serial electrical lanes having a 25-Gpbs data rate or a plurality of serial electrical lanes having a 10-Gpbs data rate, and high-speed signals in conformance with said second connector specifications comprise a plurality of serial electrical lanes having a 10-Gpbs data rate.

14. The adapter device as claimed in claim 1, wherein said second mechanical specifications and said second connector specifications are according to 100 G Form factor Pluggable Multi-Source Agreement (CFP MSA) and said first mechanical specifications and said first connector specifications are according to CFP2 MSA.

15. The adapter device as claimed in claim 1, wherein said first connector and said second connector are connectors in compliance with industry-Standard connector specifications.

16. The adapter device as claimed in claim 1, where said first level and said second level of rigid circuit board portions have mutually-different thicknesses.

17. An adapter device for connecting and interfacing a hot-pluggable transceiver module in conformance with first mechanical specifications and first connector specifications into a transceiver module host socket adapted to receive hot-pluggable transceiver modules in conformance with second housing form factor and second connector specifications, the adapter device comprising:

an outer housing in conformance with said second mechanical specifications, the housing having a front end that is to be accessible when the adapter device is inserted into said transceiver module host socket and having an opening for inserting said hot-pluggable transceiver module into said adapter device;

a receiving socket defined within the outer housing and in conformance with said first mechanical specifications, for receiving said hot-pluggable transceiver module when the same is inserted into the adapter device through said opening;

a rigid-flex circuit board disposed in said outer housing and having first and second levels of rigid circuit board portions and a flexible circuit board portion interconnecting said first and second levels to convey high-speed electrical signals therebetween, said first and second levels being integral with said flexible circuit board portion;

a first connector mounted on said first level of said circuit board and in conformance with said first connector specifications, for electrically connecting said hot-pluggable transceiver module to said adapter device to convey high-speed signals; and a second connector mounted on said second level of said circuit board and in conformance with said second connector specifications, for electrically connecting said adapter device into said transceiver module host socket to convey high-speed signals.

18. The adapter device as claimed in claim 17, further comprising a gearbox chip for converting high-speed signals in conformance with said first connector specifications to high-speed signals in conformance with said second connector specifications and vice-versa.

19. The adapter device as claimed in claim 18, wherein said gearbox chip is mounted on said second level of said circuit board.

20. The adapter device as claimed in claim 18, further comprising a heat riser at least partly made of a thermally conductive material and thermally linking said gearbox chip to a wall of said outer housing of said adapter device that is to be in physical contact with a heat sink of said transceiver module host socket.

21. The adapter device as claimed in claim 18, wherein said outer housing has walls transverse to said front end and wherein at least one of said walls comprises a window therethrough, said receiving socket being configured such that at least a portion of a housing of said hot-pluggable transceiver module is to extend within said window when said hot-pluggable transceiver module is inserted into said adapter device.

22. The adapter device as claimed in claim 18, wherein high-speed signals in conformance with said first connector specifications comprise a plurality of serial electrical lanes having a 25-Gpbs data rate, and high-speed signals in conformance with said second connector specifications comprise a plurality of serial electrical lanes having a 10-Gpbs data rate.

\* \* \* \* \*